US011063183B2

United States Patent

Emura et al.

(10) Patent No.: US 11,063,183 B2
(45) Date of Patent: Jul. 13, 2021

(54) LIGHT EMITTING ELEMENT

(71) Applicant: NICHIA CORPORATION, Anan (JP)

(72) Inventors: Keiji Emura, Anan (JP); Shun Kitahama, Tokushima (JP); Yasuo Miyoshi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 52 days.

(21) Appl. No.: 15/045,680

(22) Filed: Feb. 17, 2016

(65) Prior Publication Data
US 2016/0254413 A1 Sep. 1, 2016

(30) Foreign Application Priority Data

Feb. 26, 2015 (JP) .............................. JP2015-036172
Dec. 3, 2015 (JP) .............................. JP2015-236336

(51) Int. Cl.
*H01L 33/38* (2010.01)
*H01L 33/24* (2010.01)
*H01L 33/62* (2010.01)

(52) U.S. Cl.
CPC ............ *H01L 33/387* (2013.01); *H01L 33/24* (2013.01); *H01L 33/38* (2013.01); *H01L 33/62* (2013.01); *H01L 33/382* (2013.01)

(58) Field of Classification Search
CPC ...................................................... H01L 33/38
USPC .......................................................... 257/99
See application file for complete search history.

(56) References Cited

U.S. PATENT DOCUMENTS

| 6,307,218 B1 | 10/2001 | Steigerwald et al. |
| 2003/0107053 A1 | 6/2003 | Uemura et al. |
| 2003/0218176 A1 | 11/2003 | Zhao et al. |
| 2004/0012958 A1 | 1/2004 | Hashimoto et al. |
| 2004/0232454 A1 | 11/2004 | Uemura et al. |
| 2006/0284191 A1* | 12/2006 | Yang ...................... H01L 33/38 257/79 |
| 2007/0148803 A1 | 6/2007 | Yakushiji et al. |
| 2008/0171432 A1* | 7/2008 | Clevenger ......... H01L 21/76808 438/619 |
| 2009/0283789 A1 | 11/2009 | Kim et al. |

(Continued)

FOREIGN PATENT DOCUMENTS

| EP | 2597688 A1 | 5/2013 |
| EP | 2750206 A2 | 7/2014 |

(Continued)

OTHER PUBLICATIONS

Extended European Search Report of the corresponding European Patent Application No. 16154966.2, dated Jun. 27, 2016.

*Primary Examiner* — Hsin Yi Hsieh
(74) *Attorney, Agent, or Firm* — Global IP Counselors, LLP

(57) ABSTRACT

A light emitting element includes a semiconductor layer which is in a planar shape of a polygon at least of a pentagon, a second electrode provided on the semiconductor layer, and a first electrode provided on the semiconductor layer and having a first pad portion, a first extension portion that extends from the first pad portion along an imaginary circle to which the first pad portion is tangent on the inside and whose center is at the same location as center of gravity of the polygon shape, and a second extension portion that extends along the imaginary circle from the first pad portion on the opposite side from the first extension portion.

14 Claims, 9 Drawing Sheets

(56) References Cited

U.S. PATENT DOCUMENTS

| | | |
|---|---|---|
| 2010/0025705 A1 | 2/2010 | Wang et al. |
| 2010/0237381 A1 | 9/2010 | Kamiya |
| 2012/0018766 A1 | 1/2012 | Emura |
| 2013/0240919 A1 | 9/2013 | Park et al. |
| 2014/0175503 A1 | 6/2014 | Hwang et al. |
| 2014/0183564 A1 | 7/2014 | Sato |
| 2015/0076536 A1* | 3/2015 | Ou .................. H01L 27/15 257/91 |
| 2015/0243843 A1 | 8/2015 | Park et al. |
| 2016/0240736 A1* | 8/2016 | Goldbach ............ H01L 33/20 |

FOREIGN PATENT DOCUMENTS

| | | |
|---|---|---|
| GB | 2343994 A | 5/2000 |
| JP | 2000-164930 A | 6/2000 |
| JP | 2001-345480 A | 12/2001 |
| JP | 2002-319704 A | 10/2002 |
| JP | 2002-319705 A | 10/2002 |
| JP | 2005-039284 A | 2/2005 |
| JP | 2006-135309 A | 5/2006 |
| JP | 2008-521210 A | 6/2008 |
| JP | 2009-278056 A | 11/2009 |
| JP | 2010-225771 A | 10/2010 |
| JP | 2013-541855 A | 11/2013 |
| WO | 2006-054616 A1 | 5/2006 |
| WO | 2012-011458 A1 | 1/2012 |

\* cited by examiner

LIGHT EMITTING ELEMENT

CROSS-REFERENCE TO RELATED APPLICATIONS

This application claims priority to Japanese Patent Application Nos. 2015-36172 and 2015-236336 filed on Feb. 26, 2015 and Dec. 3, 2015. The entire disclosure of Japanese Patent Application Nos. 2015-36172 and 2015-236336 is hereby incorporated herein by reference.

BACKGROUND

1. Technical Field

The present disclosure relates to a light emitting element.

2. Description of Related Art

Many different light emitting elements have been developed in the past in an effort to make uniform light emission possible. For example, a light emitting element has been proposed in which the electrode structure of the light emitting element, whose planar shape is quadrangular, is such that either a first electrode or a second electrode is disposed on the top face of the light emitting element, and the other electrode is disposed surrounding the periphery of the one electrode (for example, JP2010-225771A, JP2002-319705A and WO2012/011458). With this electrode structure, a uniform distribution of current density is achieved, so that light is emitted uniformly over the entire top face of the light emitting element.

There is a need for a light emitting element that offers more uniform distribution of current density than the distribution of current density resulting from these various electrode structures, and that emits more uniform light over the entire top face of the light emitting element.

SUMMARY

A light emitting device of the present disclosure includes a semiconductor layer which is in a planar shape of a polygon at least of a pentagon, a second electrode provided on the semiconductor layer, and a first electrode provided on the semiconductor layer. The first electrode has a first pad portion, a first extension portion that extends from the first pad portion along an imaginary circle to which the first pad portion is tangent on the inside and whose center is at the same location as center of gravity of the polygon shape and, a second extension portion that extends along the imaginary circle from the first pad portion on the opposite side from the first extension portion.

Another light emitting device of the present disclosure includes a semiconductor layer which is in a planar shape of a polygon at least of a pentagon, a second electrode provided on the semiconductor layer, and a first electrode provided on the semiconductor layer. The first electrode has a first pad portion being localized to inside with respect to a imaginary circle whose center is at the same location as center of gravity of the polygon shape, a first extension portion that extends from the first pad portion so as to overlap the imaginary circle, a second extension portion that extends so as to overlap the imaginary circle from the first pad portion on the opposite side from the first extension portion.

Still another light emitting device of the present disclosure includes a semiconductor layer which is in a planer shape of hexagon, and a first electrode and a second electrode provided on the semiconductor layer. The first electrode has a first pad portion that is disposed near one side constituting the hexagon, a first extension portion that extends from the first pad portion along an imaginary circle whose center is at the same location as center of gravity of the hexagon, and a second extension portion that extends along the imaginary circle from the first pad portion on the opposite side from the first extension portion. The second electrode has a second pad portion that is disposed near another side facing to the one side constituting the hexagon, and more inside than the imaginary circle.

Disclosed herein is a light emitting element, wherein it is possible to provide a light emitting element with which uneven current density distribution can be further reduced.

DETAILED DESCRIPTION OF THE INVENTION

Figure 1A:
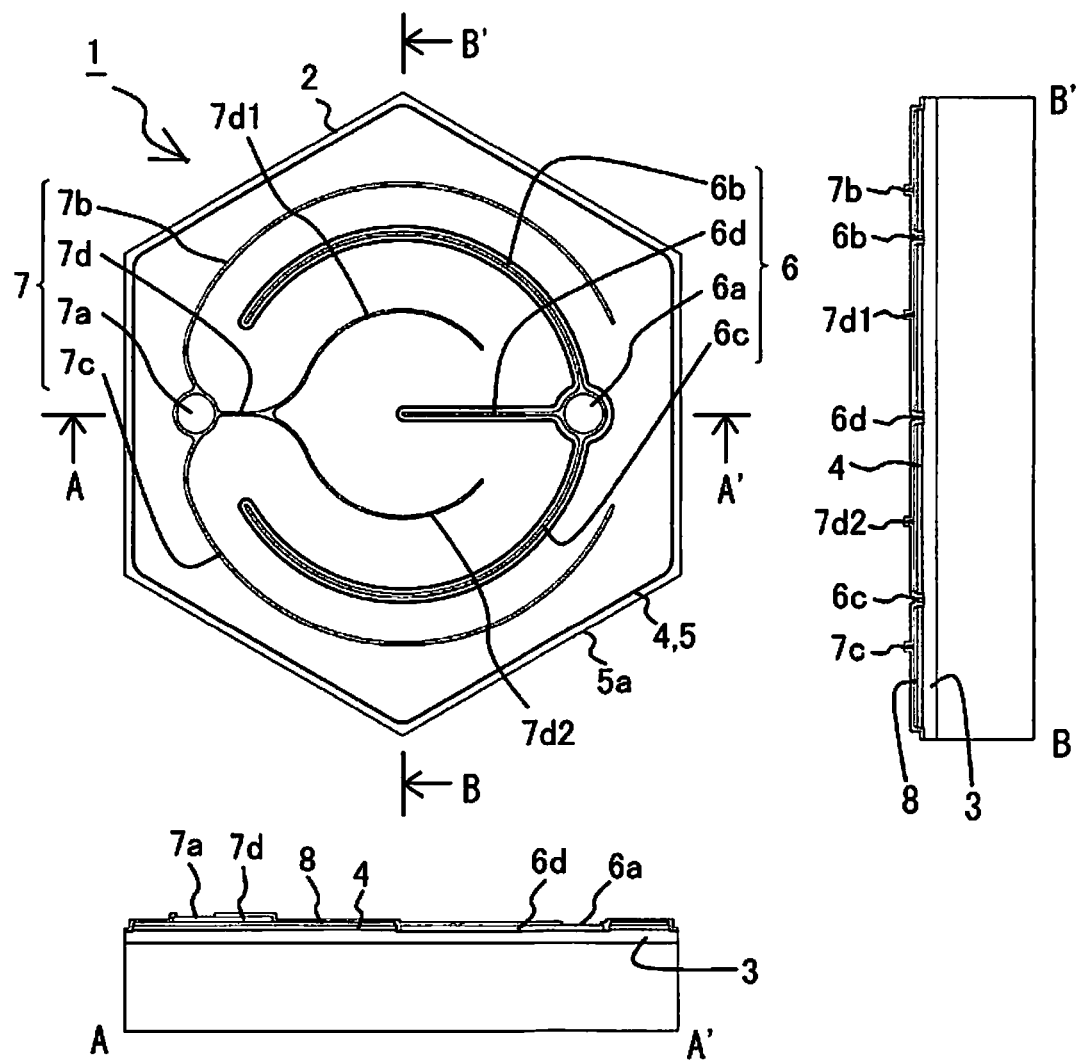
FIG. 1A are a schematic plan view of the light emitting element according to Example 1, and schematic side views along the A-A' line and the B-B' line.

A plurality of structural elements disclosed herein may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

The light emitting element disclosed herein has a semiconductor layer, and a first electrode and second electrode provided on the semiconductor layer.

Semiconductor Layer

The semiconductor layer is the light emitting part of the light emitting element. There are no particular restrictions on the material of this layer, but examples include $In_xAl_yGa_{1-x-y}N$ ($0 \leq X$, $0 \leq Y$, $X+Y \leq 1$) and other such nitride semiconductor materials.

The semiconductor layer is usually made up of a plurality of layers. For example, it may be made up of a first conductivity type semiconductor layer, a second conductivity type semiconductor layer, and an active layer that is disposed in between the first conductivity type semiconductor layer and the second conductivity type semiconductor layer. The first conductivity type semiconductor layer and the second conductivity type semiconductor layer have mutually different conduction types.

The first conductivity type semiconductor layer and the second conductivity type semiconductor layer may each have a single-layer structure or a laminated structure. In the case of a laminated structure, not all of the layers constituting the first conductivity type semiconductor layer or the second conductivity type semiconductor layer need to exhibit the first conductivity type or the second conductivity type. The active layer may be either a single quantum well structure or a multiple quantum well structure formed as a thin-film that produces a quantum effect.

The semiconductor layer is usually laminated over a substrate. There are no particular restrictions on the material of the substrate, but an example is sapphire ($Al_2O_3$). The light emitting element does not necessarily have to have this substrate.

In order for the first electrode and second electrode (discussed below) to be disposed on the same face side of the semiconductor layer, either the second conductivity type semiconductor layer is disposed on the first conductivity type semiconductor layer so that part of the first conductivity type semiconductor layer is exposed, or the first conductivity type semiconductor layer is disposed on the second conductivity type semiconductor layer so that part of the second conductivity type semiconductor layer is exposed, for example.

There are no particular restrictions on the planar shape of the light emitting element and/or the semiconductor layer, but the light emitting element and/or the semiconductor layer which is in a planar shape of a circular, or a polygon at least of a pentagon is preferable. With a polygon shape, a regular polygon shape is preferable. Examples of preferable polygon shapes include pentagonal, hexagonal, octagonal, decagonal, and dodecagonal. Hexagons are particularly preferable from the standpoint of production because hexagons can be densely arranged on a substrate. The corners of the polygon shape may be rounded off. The planar shapes of the light emitting element and the semiconductor layer are preferably either the same or similar, but one, and particularly the semiconductor layer, may be one of the above-mentioned planar shapes.

A diagonal line of the top face of the semiconductor layer (that is, the maximum length or the diameter) is, for example, about a few hundred to a few thousand microns long, with about 450 to 1700 μm being preferable.

First Electrode and Second Electrode

The first electrode and second electrode provided on the semiconductor layer are preferably disposed on the same face side of the semiconductor layer. It is particularly preferable for the first electrode to be electrically connected, either directly or indirectly, to the first conductivity type semiconductor layer, and for the second electrode to be electrically connected, either directly or indirectly, to the second conductivity type semiconductor layer.

The first electrode or the second electrode is preferably disposed further to the inside than the periphery of the semiconductor layer. In other words, it is preferable for the first electrode to be surrounded by the second conductivity type semiconductor layer and/or for the second electrode to be surrounded by the first conductivity type semiconductor layer. This allows current to be diffused all the way around the first electrode or second electrode. All or part of the first electrode may be surrounded by the second electrode, and vice versa. That is, all or part of the n-side electrode may be surrounded by the p-side electrode, or all or part of the p-side electrode may be surrounded by the n-side electrode. The former arrangement is preferable when ensuring adequate surface area of the active layer is taken into account.

The first electrode has a first pad portion. In addition to this first pad portion, the first electrode preferably also has a first extension portion and a second extension portion that extend from the first pad portion. In addition to, or in place of, the first extension portion and the second extension portion, the first electrode may have a fifth extension portion that extends toward a second pad portion (discussed below).

The second electrode has a second pad portion. In addition to this second pad portion, the second electrode preferably also has a third extension portion and a fourth extension portion that extend from the second pad portion. In addition to, or in place of, the third extension portion and the fourth extension portion, the second electrode may have a sixth extension portion that extends toward the first pad portion.

First Pad Portion and Second Pad Portion

Because external connection members are connected for supplying current to the light emitting element, the first pad portion and second pad portion are members used to form a bump or to bond a wire, for example.

The first pad portion and the second pad portion are preferably localized at opposite locations of the semiconductor layer, respectively (such as opposite sides or vertexes) in plan view. For instance, the first pad portion and second pad portion are preferably disposed on the center line of the semiconductor layer, respectively (depending on the shape of the semiconductor layer, this might be a "line that passes through the center of gravity" of the polygon shape), and are more preferably disposed at locations closer to the periphery than to the center of the semiconductor layer (depending on the shape of the semiconductor layer, this might be the "center of gravity"). The term "center line of the semiconductor layer" here means a line passing through the center or center of gravity of the semiconductor layer. In this Specification, however, the center line, the line that passes through the center of gravity, the center, the center of gravity, and so forth are permitted to vary within a range of a few microns to a few dozen microns, depending on the precision with which the semiconductor layer is machined and so on.

In the case where the planar shape of the semiconductor layer is polygon, the first pad portion and the second pad portion may both be disposed opposite a vertex of the polygon shape, but from the standpoint of reducing bias in the current density distribution, they are preferably disposed opposite a side of the polygon shape, and are more preferably disposed opposite the center of a side of the polygon shape, or in other words, on a perpendicular bisector of one of the sides constituting the polygon shape. It is especially preferable for the first pad portion to be localize to the inside with respect to a first imaginary circle (discussed below).

That is, this means that the first pad portion accounts for a large proportion on the inside of the first imaginary circle. The second pad portion is preferably disposed on a perpendicular bisector of one of the sides constituting the polygon shape, and particularly a hexagon.

The planar shape of the first pad portion and second pad portion can be suitably adjusted according to the size of the light emitting element, the electrode layout, and so forth. For example, it can be circular, a regular polygon shape, or another such shape. It is especially preferable, when ease of wire bonding is taken into account, for the shape to be circular or nearly circular. The size of the first pad portion and second pad portion can also be suitably adjusted according to the size of the light emitting element, the electrode layout, and so forth. For example, these portions can be substantially circular and have a diameter of about 70 to 150 µm.

First Extension Portion and Second Extension Portion

The first extension portion and second extension portion extending from the first pad portion preferably extend along a first imaginary circle to which the first pad portion is tangent on the inside. In particular, the first extension portion and second extension portion preferably extend from both sides of the first pad portion, or the second extension portion extends from the first pad portion to the opposite side. The "opposite side" here refers to the different side with respect to the line passing through the center of gravity of the first pad portion and the center of gravity of the polygon shape that is the planar shape of the semiconductor layer, for example. Consequently, in the first electrode, the first pad portion, which has a tendency for the current density to be higher at the periphery where it is disposed, can be prevented from moving locally closer to the periphery of the semiconductor layer, so this lessens the unevenness of current that occurs between the first pad portion and the periphery of the semiconductor layer. As a result, unevenness of the current density distribution can be further reduced.

The size and position of the first imaginary circle can be set as desired, as long as the first pad portion is tangent on the inside. It is especially preferable for this circle to be more to the inside than the periphery of the semiconductor layer in plan view. The center of the first imaginary circle can be set so that the distance from the first electrode to the periphery of the semiconductor layer (a side or vertex in the case where the planar shape of the semiconductor layer is polygon, for example) is uniform, so it is preferably the same as the center of the semiconductor layer, that is, the same as the center of gravity of the polygon shape that is the planar shape of the semiconductor layer. However, although the center of the first imaginary circle is said here to be the same as the center or the center of gravity of the semiconductor layer, as discussed above, it is preferable for the first imaginary circle to coincide completely with the center of the center of gravity of the semiconductor layer, but as long as no bias occurs in the current density distribution, the center may be shifted within the range of about the diameter of the first pad portion (the so-called maximum length), and preferably within the range of about the radius (see FIG. 6E). The first imaginary circle is preferably a circle that surrounds about 55 to 80% of the total surface area of the semiconductor layer, and more preferably surrounds about 65 to 70%. In other words, the diameter of the first imaginary circle is preferably at least 65% and more preferably no more than 80% with respect to the diameter or a diagonal of the semiconductor layer, that is, the longest line passing through the center of the semiconductor layer.

The phrase "along the first imaginary circle" means being disposed on the first imaginary circle, extending while tangent to the inside or the outside of the first imaginary circle, or extending in a parallel way and separated from the first imaginary circle, etc. This portion that goes along the first imaginary circle is preferably the entire first extension portion and second extension portion, but may just be a portion thereof. It is especially preferable to be disposed on the first imaginary circle, or to extend either tangent to the outside of the first imaginary circle or separated from the outside of the first imaginary circle, which reduces current bias that occurs between the first pad portion and the periphery of the semiconductor layer. However, although the first extension portion and second extension portion are separated from the first imaginary circle, the distance thereof is preferably no more than twice the width of the first extension portion and second extension portion, and more preferably no more than 1.5 times, and even more preferably no more than equal to this width.

The first extension portion and second extension portion preferably extend to near the second pad portion of the second electrode, for example. The first extension portion and second extension portion may be linked together at their distal ends along the first imaginary circle, but when light extraction from the upper face side of the semiconductor layer is taken into account, these distal ends may separate from each other near the second pad portion so that the increase in surface area of the first extension portion and second extension portion can be kept to a minimum. The distance by which the first extension portion and second extension portion separate here is, for example, about two to six times the diameter (the so-called maximum length) of the first pad portion and/or the second pad portion around the periphery of the first imaginary circle.

The first extension portion and second extension portion are preferably disposed symmetrical to a line that passes through the center of the semiconductor layer and the first pad portion, or more precisely, a line that passes through the center of gravity of the semiconductor layer (i.e., the polygon shape) and the center of gravity of the first pad (hereinafter, the definition is same as above). That is, the first extension portion and second extension portion are preferably arc shaped. The first extension portion and second extension portion preferably have the same length and width. For example, the overall length of each is preferably about 30 to 40%, and more preferably about 35%, of the outer periphery of the semiconductor layer. The width of each is preferably about 0.5 µm to about dozen or so microns.

Fifth Extension Portion

The fifth extension portion optionally had by the first electrode preferably extends, for example, to the inside of the third extension portion and fourth extension portion of the second electrode (discussed below), that is, into the region bounded by the third extension portion and the fourth extension portion. Also, the end of the fifth extension portion may branch into two or three parts along the third extension portion and the fourth extension portion (discussed below). In other words, the distal end of the fifth extension portion preferably extends more to the inside than the first imaginary circle, that is, more to the inside than the first extension portion and the second extension portion, along the first imaginary circle, or in other words the first extension portion and/or the second extension portion. The fifth extension portion, which is closer to the first pad portion, has a tendency to have higher current density than the first extension portion and second extension portion, so the distance from the fifth extension portion to the third extension portion and the fourth extension portion is preferably greater than the distance from the first extension portion and second extension portion to the third extension portion and fourth extension portion. The term "along" here means extending in a parallel way, separated from the first imaginary circle, the first extension portion, and the second extension portion.

The two distal end branches of the fifth extension portion may extend along the first imaginary circle and be linked together, or may be separated on the second pad portion side of the second electrode. The distance at which the distal ends of the fifth extension portion are separated here is, for example, about 1.5 to 5 times the diameter (the so-called maximum length) of the first pad portion and/or the second pad portion.

The two branched parts of the fifth extension portion preferably branch in a curve to the inside. A shape such as this prevents a sudden change in the electrode shape at the branching parts. Furthermore, the two branched parts of the fifth extension portion curve to the inside and separate, which causes them to curve respectively along the third extension portion and the fourth extension portion, so the diffusion of current can be made more uniform between the fifth extension portion and the third extension portion, and the fifth extension portion and the fourth extension portion.

The two branched parts of the fifth extension portion are preferably disposed symmetrical to a line that passes through the center of the semiconductor layer and the first pad portion. That is, the two branched parts of the fifth extension portion preferably have the same length and width. For example, the overall length of each is preferably about 10 to 20%, and more preferably about 15%, of the outer periphery of the semiconductor layer. The width of each is preferably about 0.5 µm to about dozen or so microns.

Part of the fifth extension portion, or one of its three branches, may extend in a straight line.

Third Extension Portion and Fourth Extension Portion

The third extension portion and fourth extension portion extending from the second pad portion preferably have their entire length, that is, the entire second electrode, disposed more to the inside than the first imaginary circle. The third extension portion preferably extends along the first extension portion, and the fourth extension portion preferably extends along the second extension portion of the first electrode. The term "along" here means extending in a parallel way, separated from the first imaginary circle, the first extension portion, and the second extension portion. It is particularly preferable for the third extension portion and the fourth extension portion to be concentric with the first imaginary circle and to extend along a second imaginary circle to which the second pad portion is tangent on the outside.

The size and position of the second imaginary circle can be suitably set according to the position of the second pad portion. It is especially preferable for the second imaginary circle to have a diameter that is about 70 to 90%, and more preferably about 80%, of that of the first imaginary circle.

The phrase "along the second imaginary circle" means being disposed on the second imaginary circle, extending while tangent to the inside or the outside of the second imaginary circle, extending in a parallel way and separated from the second imaginary circle, etc. This portion that goes along the second imaginary circle may just be a portion of the third extension portion and the fourth extension portion, but is preferably all of them. It is especially preferable for the third extension portion and the fourth extension portion to be disposed on the second imaginary circle, and more preferable for the third extension portion and the fourth extension portion to be formed in an arc shape. The distance from the second imaginary circle to the third extension portion and the fourth extension portion here is preferably no more than two times the width of the third extension portion and the fourth extension portion, and more preferably no more than 1.5 times, or no more than equal to this width.

The third extension portion and fourth extension portion preferably extend to a position that is opposite the second pad portion, for example, to near the first pad portion of the first electrode. The third extension portion and the fourth extension portion preferably extends along the second imaginary circle, and the distal ends of the third extension portion and fourth extension portion are preferably separated on the first pad portion side of the first electrode. The distance by which the third extension portion and fourth extension portion separate here is, for example, about 1.5 to 5 times the diameter (the so-called maximum length) of the first pad portion and/or the second pad portion around the periphery of the second imaginary circle.

The third extension portion and the fourth extension portion are preferably disposed symmetrical to a line that passes through the center of gravity or the center of the semiconductor layer and the second pad portion. That is, the third extension portion and the fourth extension portion preferably have the same length and width. For example, the overall length of each is preferably about 20 to 30%, and more preferably about 25%, of the outer periphery of the semiconductor layer. The width of the third extension portion and the fourth extension portion is preferably about 1 µm to about dozen or so microns for each.

Sixth Extension Portion

The sixth extension portion optionally had by the second electrode is preferably disposed between the third extension portion and the fourth extension portion, and is preferably disposed between the branched parts of the fifth extension portion of the first electrode. In other words, the sixth extension portion preferably extends toward the first pad portion, either branching or not branching. The sixth extension portion more preferably passes through the center of the semiconductor layer, that is, the center of the first imaginary circle and the center of the second imaginary circle. The sixth extension portion may extend linearly toward the first pad portion, with its distal end disposed near the center of the semiconductor layer, or may be disposed so that its distal end branches so as to surround the center of the semiconductor layer.

The overall length of the sixth extension portion is preferably about 20 to 40% of the diameter or maximum length of the semiconductor layer, and more preferably about 25 to 35%. The width of the sixth extension portion is preferably about 1 µm to about a dozen or so microns.

Positional Relation of Extension Portions

In an embodiment, in the case where the shape of the semiconductor layer top face is hexagonal or another such polygon shape, the positions of the first to sixth extension portions preferably have the relations shown in Table 1 below (see FIG. 1B). The values in Table 1 are for when the length of a diagonal of the semiconductor layer top face is 100%, or more specifically, 950 µm.

TABLE 1

| | Length with respect to diagonal of semiconductor layer top face | Specific Length |
|---|---|---|
| Length between vertices of semiconductor layer and first and second extension portions: m | 10 to 25% | 95 to 235 μm (preferably 120 μm) |
| Length between sides of semiconductor layer and first and second extension portions: n | 4 to 15% | 38 to 140 μm (preferably 60 μm) |
| Length between first to third extension portions: q | 5 to 20% | 8 to 140 μm (preferably 75 μm) |
| Length between third extension portions and branched parts of fifth extension portions: r | 10 to 25% | 95 to 235 μm (preferably 120 μm) |
| Length between sixth extension portion and branched parts of fifth extension portion: s | 15 to 30% | 140 to 285 μm (preferably 160 μm) |

The closer an extension portion is to the first pad portion or second pad portion, the more the surrounding current density will tend to be higher, so it is particularly preferable for the extension portions to be disposed so that the distance between extension electrodes satisfies the relation n<q<r<s.

The first electrode and second electrode can be made from aluminum or another such metal, or an alloy of these metals. It is especially preferable to use a multilayer structure in which metals are laminated in the order of Ti/Pt/Au, CrRh/Pt/Au, or the like.

A conductive layer is preferably disposed between the semiconductor layer and the first electrode or second electrode. This conductive layer is used to allow current supplied from the first electrode or the second electrode to flow uniformly over the entire plane of the first conductivity type semiconductor layer or the second conductivity type semiconductor layer. A metal thin-film can be used as this conductive layer, but since it is disposed on the light extraction side of the light emitting element, it is preferable to use a conductive oxide layer that absorbs less light even than a metal thin-film. Examples of conductive oxides include one or more kinds of oxide of elements selected from among zinc, indium, tin, and magnesium, such as ZnO, $In_2O_3$, $SnO_2$, ITO (Indium Tin Oxide), IZO (Indium Zinc Oxide), GZO (Gallium-doped Zinc Oxide).

The light emitting element according to a Example of the present disclosure will now be described in detail through reference to the drawings. The size, positional relation, and so forth of the members shown in the drawings may be exaggerated to make the description clearer. As a general rule, names and symbols that are the same refer to members that are the same, analogous, or have the same function, and detailed descriptions of these may be omitted.

Example 1

Figure 1B:
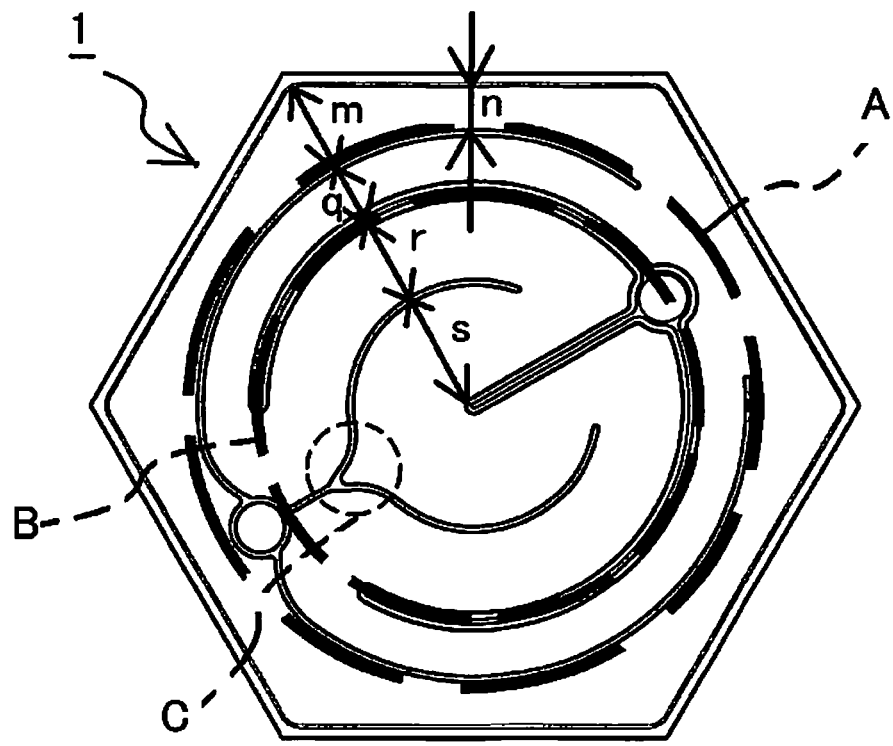
FIG. 1B is a schematic plan view of the light emitting element according to Example 1 shown in FIG. 1A, and is used to illustrate the layout of the first electrode and second electrode.

As shown in FIG. 1A, the light emitting element 1 according to Example 1 comprises a substrate 2, a semiconductor layer 5 consisting of an n-type conductor layer 3 (a second conductivity type semiconductor layer) provided over the substrate 2, an active layer, and a p-type conductor layer 4 (a first conductivity type semiconductor layer), in that order, an n-side electrode (a second electrode 6) formed over the n-type conductor layer 3, and a p-side electrode (a first electrode 7) that is disposed over the p-type conductor layer 4 and surrounding the n-side electrode.

The substrate 2 and the semiconductor layer 5 (and particularly the p-type conductor layer 4) are substantially hexagonal in plan view. The length of one side of the semiconductor layer 5 is approximately 480 μm and the length of a diagonal is approximately 960 μm.

The first electrode 7 is formed on the p-type conductivity layer 4. A light transmissive conductive layer 8 that is formed on substantially the entire surface of the p-type conductivity layer 4 is disposed between the second electrode 6 and the p-type conductivity layer 4. The first electrode 7 is electrically connected to the p-type conductivity layer 4 via the conductive layer 8.

The second electrode 6 is formed on the n-type conductivity layer 3 that is exposed by removing part of the p-type conductivity layer 4 and the active layer (out of the semiconductor layer 5), and is electrically connected to the n-type conductivity layer 3. The second electrode 6 is surrounded by p-type conductivity layer 4 and the active layer.

The semiconductor layer 5, the second electrode 6, and the first electrode 7 are covered by a protective film, except for a second pad portion 6a and a first pad portion 7a (discussed below).

The second electrode 6 and the first electrode 7 respectively includes the second pad portion 6a and the first pad portion 7a, which are electrically connected to an external circuit. The second pad portion 6a and the first pad portion 7a are respectively disposed at one end and the other end on the center line of the semiconductor layer 5. This center line is parallel to one side of the semiconductor layer 5, and is a line that passes through the center of the semiconductor layer 5, that is, the center of gravity of a polygon shape (such as a regular hexagon). The second pad portion 6a and the first pad portion 7a are substantially circular in shape, having a diameter of approximately 100 μm. The distance between the second pad portion 6a and the first pad portion 7a is approximately 600 μm.

The second pad portion 6a and the first pad portion 7a are each disposed near a side 5a (one of the sides of a hexagon), on a line that passes through the center of the side 5a and is perpendicular to the side 5a (a so-called perpendicular bisector).

A first extension portion 7b and a second extension portion 7c that extend from both sides of the first pad portion 7a extend in an arc shape, and are disposed along a first imaginary circle A (see FIG. 1B) to which the first pad portion 7a is tangent on the inside, that is, substantially all of these portions are disposed on the first imaginary circle A. The first pad portion 7a is offset or localized to the inside with respect to the first imaginary circle A. The first extension portion 7b and the second extension portion 7c are disposed symmetrical to a line that passes through the center of the semiconductor layer 5 and the first pad portion 7a. The dotted line in FIG. 1B (such as the first imaginary circle A and a second imaginary circle B) are imaginary reference lines for when the first electrode and second electrode are disposed, and are not formed on the actual light emitting element.

The first imaginary circle A is within the semiconductor layer 5 in plan view, is concentric with the center of the semiconductor layer 5, that is, with the center of gravity of the polygon shape, and has a radius of approximately 360 μm.

The first extension portion 7b and the second extension portion 7c extend to a position that is opposite the first pad portion 7a, i.e., to near the second pad portion 6a of the second electrode 6. The first extension portion 7b and the second extension portion 7c are separated near the second pad portion 6a of the second electrode 6. The distance between the first extension portion 7b and the second extension portion 7c is about 290 µm at the periphery of the first imaginary circle A.

The first extension portion 7b and the second extension portion 7c each have an overall length of about 940 µm, and a width of about 5 µm.

The first electrode 7 has a fifth extension portion 7d that extends from the first pad portion 7a toward the second pad portion 6a. The fifth extension portion 7d extends to the inside of a third extension portion 6b and a fourth extension portion 6c of the second electrode 6 (discussed below). The end of the fifth extension portion 7d extends in two branches along the third extension portion 6b and the fourth extension portion 6c (discussed below). That is, the distal ends 7d1 and 7d2 of the fifth extension portion 7d extend along the first extension portion 7b and the second extension portion 7c more to the inside than the first imaginary circle A, i.e., within the region bounded by the first extension portion 7b and the second extension portion 7c.

The distal ends 7d1 and 7d2 branching off from the fifth extension portion 7d are separated to each other on the side of the second pad portion 6a of the second electrode 6. The distance between the branched distal ends 7d1 and 7d2 of the fifth extension portion 7d is about 200 µm.

The fifth extension portion 7d branches in a curve to the inside at the branching parts (see the circle C in FIG. 1).

The two branched parts of the fifth extension portion 7d are disposed symmetrical to a line that passes through the center of the semiconductor layer 5 and the first pad portion 7a. That is, the fifth extension portion 7d includes the two branched parts, its overall length is about 450 µm, and its width is about 5 µm.

The entire second electrode 6, that is, the second pad portion 6a, the third extension portion 6b, and the fourth extension portion 6c, is disposed more to the inside than the first imaginary circle A.

The third extension portion 6b extends along the first extension portion 7b of the first electrode 7, and the fourth extension portion 6c extends along the second extension portion 7c of the first electrode 7. More specifically, the third extension portion 6b and the fourth extension portion 6c are each formed in an arc shape by extending on the second imaginary circle B (see FIG. 1B), which is concentric with the first imaginary circle A, to which the first pad portion 7a is tangent on the outside. The third extension portion 6b and the fourth extension portion 6c are disposed symmetrical to a line that passes through the center of the semiconductor layer 5 and the second pad portion 6a disposed on the second imaginary circle B.

The second imaginary circle B has a diameter of approximately 560 µm.

The third extension portion 6b and the fourth extension portion 6c extend to a position opposite the second pad portion 6a, such as to near the first pad portion 7a of the first electrode 7. The distal ends of the third extension portion 6b and the fourth extension portion 6c are separated on the first pad portion 7a side of the first electrode 7, on the second imaginary circle B. The distance by which the third extension portion 6b and the fourth extension portion 6c are separated is, for example, about 290 µm at the periphery of the second imaginary circle B.

The third extension portion 6b and the fourth extension portion 6c each have an overall length of about 700 µm, and a width of about 5 µm.

The second electrode 6 further has a sixth extension portion 6d that extends in a straight line from the second pad portion 6a toward the first pad portion 7a. The sixth extension portion 6d is disposed between the third extension portion 6b and the fourth extension portion 6c. The sixth extension portion 6d is disposed on a straight line that passes through the center of the semiconductor layer 5, and its distal end is disposed at the center of the semiconductor layer 5.

The sixth extension portion 6d has an overall length of about 250 µm, and a width of about 5 µm.

The positions of the extension portions have the relations shown in Table 2 below (see FIG. 1B).

TABLE 2

| | |
|---|---|
| Length between first extension portion and vertex of semiconductor layer: m | 120 µm |
| Length between first extension portion and side of semiconductor layer: n | 60 µm |
| Length between first to third extension portions: q | 75 µm |
| Length between third extension portions to branched part of fifth extension portions: r | 120 µm |
| Length between sixth extension portion and branched part of fifth extension portion: s | 160 µm |

Modification Example 1 of Example 1

Figure 2:
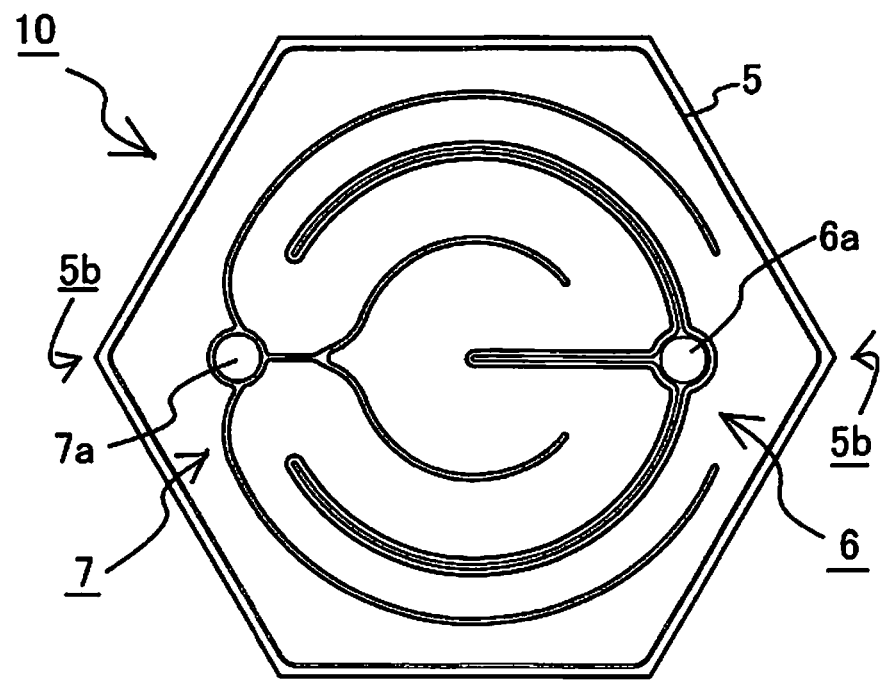
FIG. 2 is a schematic plan view of the light emitting element according to a Modification Example 1 of Example 1.

As shown in FIG. 2, the light emitting element 10 according to Modification Example 1 of Example 1 has the same configuration as the light emitting element 1, except that the first electrode 7 and the second electrode 6 are rotated 30 degrees with respect to the center of the semiconductor layer 5, and the first pad portion 7a and the second pad portion 6a are opposite a vertex 5b of the hexagon of the semiconductor layer 5.

Modification Example 2 of Example 1

Figure 3:
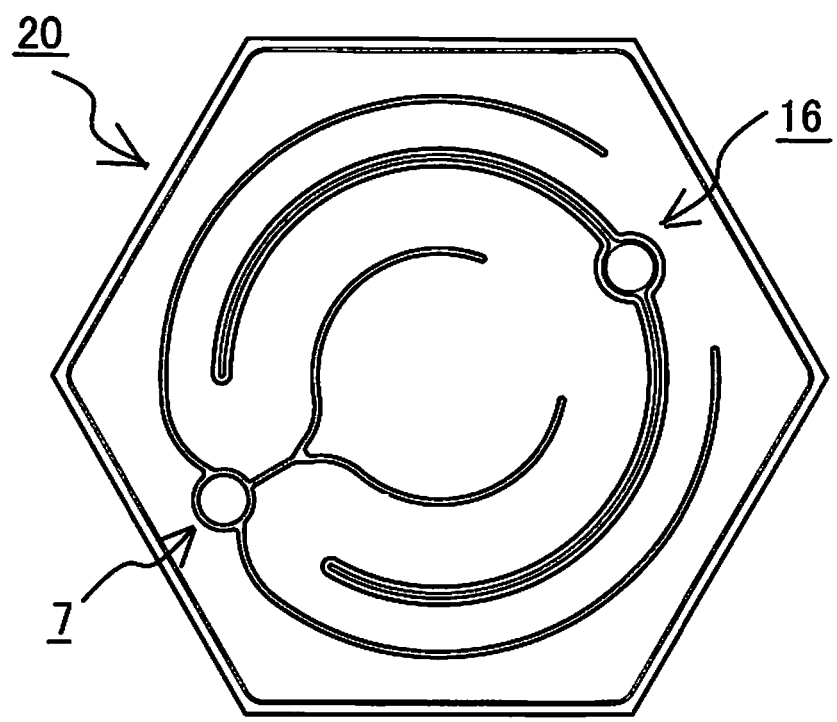
FIG. 3 is a schematic plan view of the light emitting element according to a Modification Example 2 of Example 1.

As shown in FIG. 3, the light emitting element 20 according to Modification Example 2 of Example 1 has the same configuration as the light emitting element 1, except that a second electrode 16 has no sixth extension portion.

Modification Example 3 of Example 1

Figure 4:
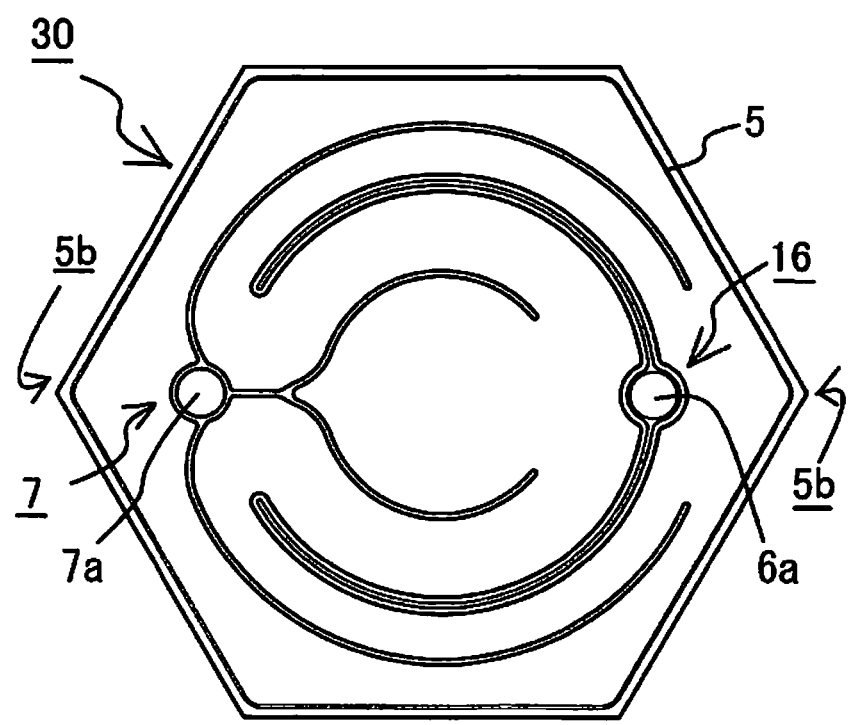
FIG. 4 is a schematic plan view of the light emitting element according to a Modification Example 3 of Example 1.

As shown in FIG. 4, the light emitting element 30 according to Modification Example 3 of Example 1 has the same configuration as the light emitting element 20, except that the first electrode 7 and the second electrode 16 are rotated 30 degrees with respect to the center of the semiconductor layer 5, and the first pad portion 7a and the second pad portion 6a are opposite the vertex 5b of the hexagon of the semiconductor layer 5.

Example 2

FIGS. 5A to 5D are schematic views of the electrode shape in the light emitting element according to Example 2.

Figure 5A:
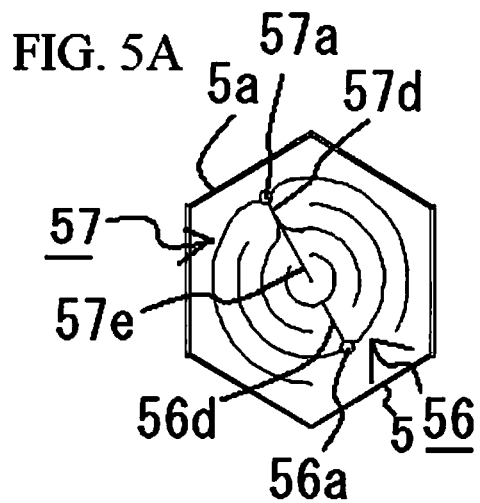
FIGS. 5A to 5D are schematic plan views of four different electrode shapes in the light emitting element according to Example 2.
Figure 5B:
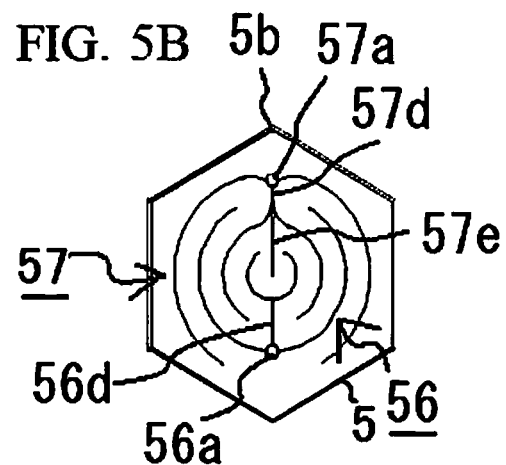

With the light emitting elements shown in FIGS. 5A and 5B, the configuration is substantially the same as that of the light emitting element 1, etc., except that the length of a diagonal of the semiconductor layer 5 is approximately 1.4 mm, a first electrode 57 has a seventh extension portion 57e that extends in a straight line from the branching part of a fifth extension portion 57d to the center of the semiconductor layer 5, and a sixth extension portion 56d of a second electrode 56 branches into two arc-shaped parts so as to surround the seventh extension portion 57e. With the light emitting element in FIG. 5A, a first pad portion 57a and a second pad portion 56a are opposite the side 5a of the semiconductor layer 5, and with the light emitting element in FIG. 5B, the first pad portion 57a and the second pad portion 56a are opposite the vertex 5b of the semiconductor layer 5.

Figure 5C:
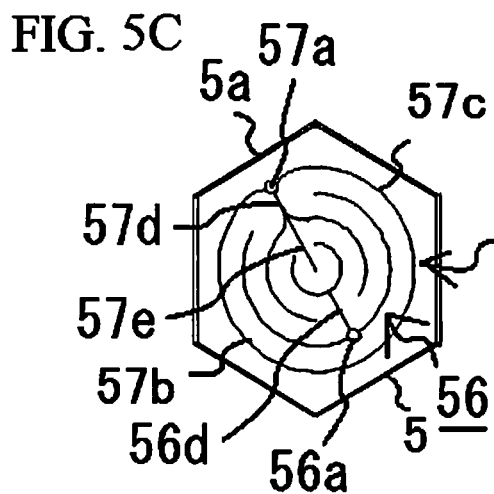
Figure 5D:
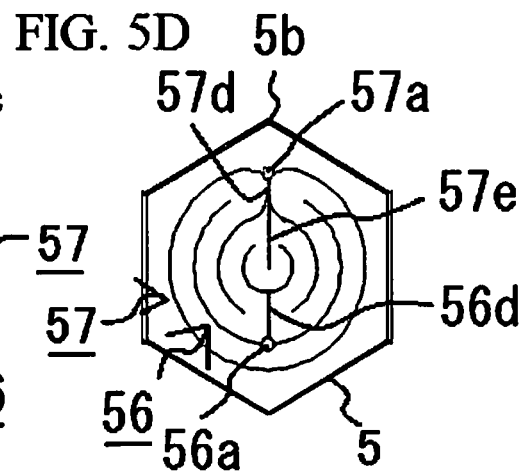

With the light emitting elements shown in FIGS. 5C and 5D, the configuration is substantially the same as that of the light emitting elements shown in FIGS. 5A and 5B, except that a first extension portion 57b and a second extension portion 57c of the first electrode 57 are linked. With the light emitting element in FIG. 5C, the first pad portion 57a and the second pad portion 56a are opposite the side 5a of the semiconductor layer 5, and with the light emitting element in FIG. 5D, the first pad portion 57a and the second pad portion 56a are opposite the vertex 5b of the semiconductor layer 5.

Example 3

FIGS. 6A to 6D are simplified views of the electrode shape in the light emitting element according to Example 3.

Figure 6A:
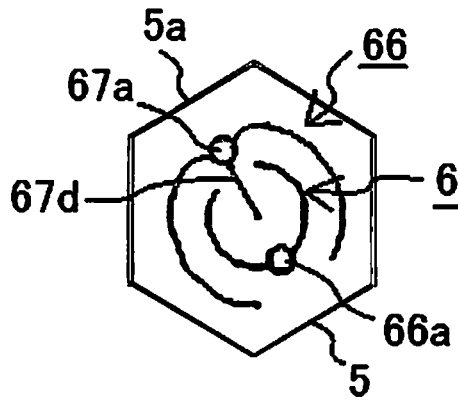
FIGS. 6A to 6E are schematic plan views of five different electrode shapes in the light emitting element according to Example 3.
Figure 6B:
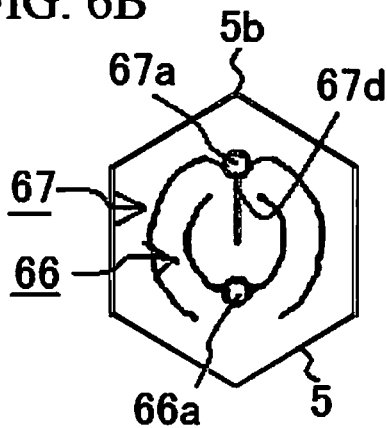

With the light emitting elements shown in FIGS. 6A and 6B, the configuration is substantially the same as that of the light emitting element 1, etc., except that the length of a diagonal of the semiconductor layer 5 is approximately 650 μm, a fifth extension portion 67d of a first electrode 67 does not branch and extends toward a second pad portion 66a to the center of the semiconductor layer 5, and a second electrode 66 does not have a sixth extension portion. With the light emitting element in FIG. 6A, a first pad portion 67a and the second pad portion 66a are opposite the side 5a of the semiconductor layer 5, and with the light emitting element in FIG. 6B, the first pad portion 67a and the second pad portion 66a are opposite the vertex 5b of the semiconductor layer 5.

Figure 6C:
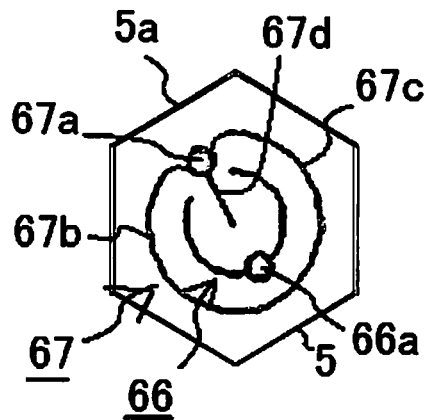
Figure 6D:
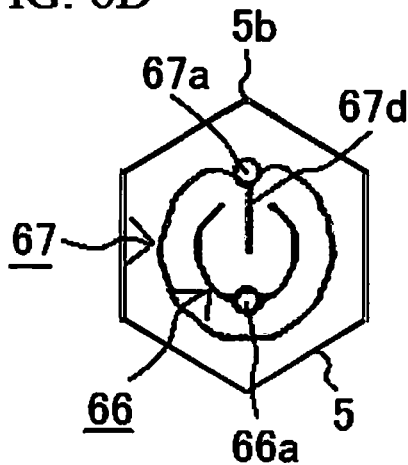

With the light emitting elements shown in FIGS. 6C and 6D, the configuration is substantially the same as that shown in FIGS. 6A and 6B, except that a first extension portion 67b and a second extension portion 67c of the first electrode 67 are linked. With the light emitting element in FIG. 6C, the first pad portion 67a and the second pad portion 66a are opposite the side 5a of the semiconductor layer 5, and with the light emitting element in FIG. 6D, the first pad portion 67a and the second pad portion 66a are opposite the vertex 5b of the semiconductor layer 5.

Figure 6E:
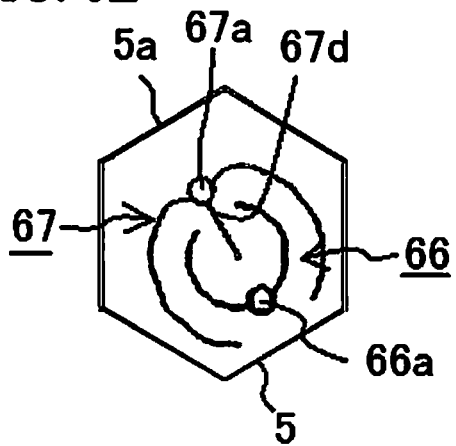

The light emitting element in FIG. 6E has substantially the same configuration as the light emitting element in FIG. 6A, except that the first electrode 67 and the second electrode 66 are shifted from the center of the semiconductor layer 5 by a distance corresponding to the radius of the first pad portion 67a.

Example 4

FIGS. 7A to 7F are simplified views of the electrode shape in the light emitting element according to Example 4.

Figure 7A:
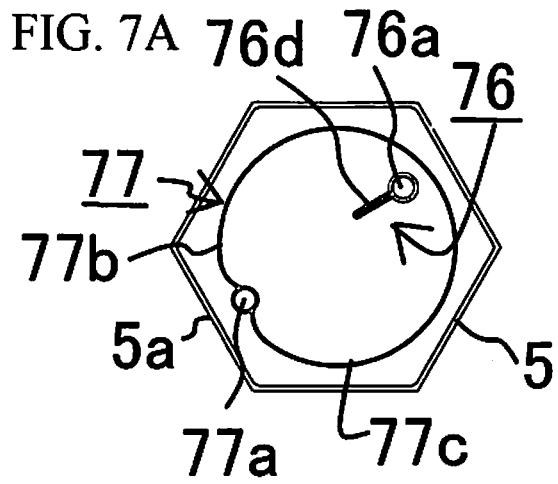
FIGS. 7A to 7F are schematic plan views of six different electrode shapes in the light emitting element according to Example 4.
Figure 7B:
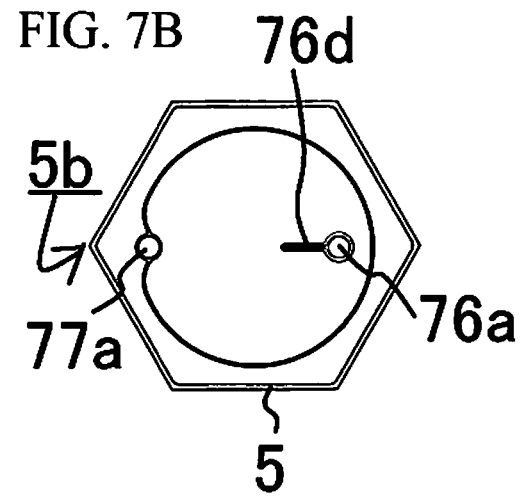

With the light emitting elements shown in FIGS. 7A and 7B, the configuration is substantially the same as that of the light emitting element 1, etc., except that the length of a diagonal of the semiconductor layer 5 is approximately 650 μm, a first extension portion 77b and second extension portion 77c of a first electrode 77 are linked, no fifth extension portion is formed, no third extension portion and fourth extension portion is formed at a second electrode 76, and a sixth extension portion is formed shorter. With the light emitting element in FIG. 7A, the first pad portion 77a and the second pad portion 76a are opposite the side 5a of the semiconductor layer 5, and with the light emitting element in FIG. 7B, the first pad portion 77a and the second pad portion 76a are opposite the vertex 5b of the semiconductor layer 5.

Figure 7C:
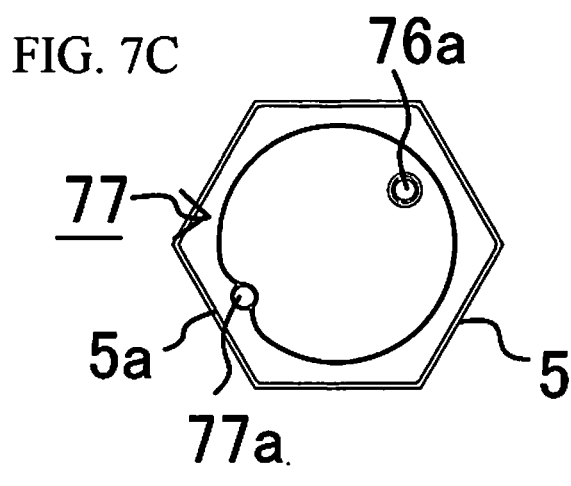
Figure 7D:
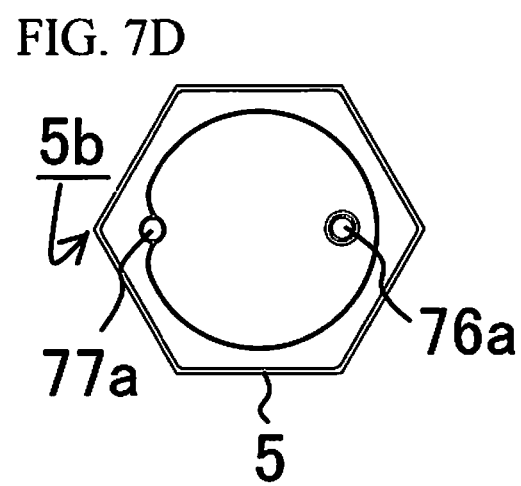

With the light emitting elements shown in FIGS. 7C and 7D, the configuration is substantially the same as that of the light emitting elements shown in FIGS. 7A and 7B, except that the second electrode is formed only at the second pad portion 76a, and no extension portions are formed. With the light emitting element in FIG. 7C, first pad portion 77a and the second pad portion 76a are opposite the side 5a of the semiconductor layer 5, and with the light emitting element in FIG. 7D, first pad portion 77a and the second pad portion 76a are opposite the vertex 5b of the semiconductor layer 5.

Figure 7E:
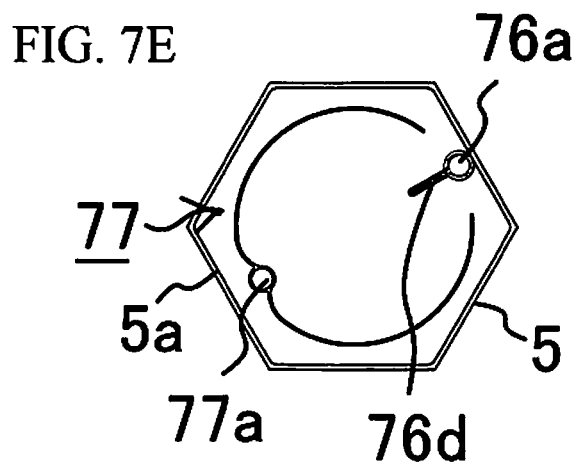
Figure 7F:
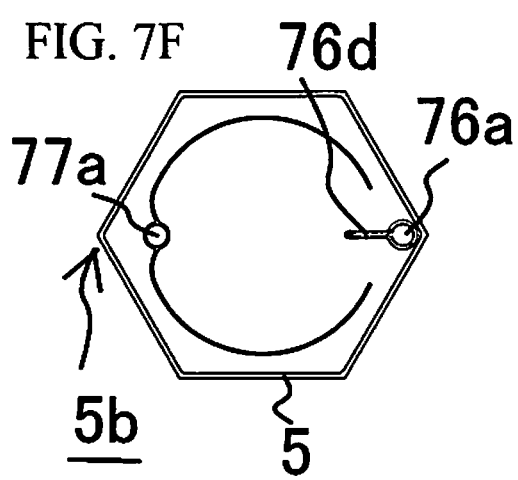

The light emitting elements in FIGS. 7E and 7F have the same configuration as the light emitting elements in FIGS. 7A and 7B, except that the distal ends of the first extension portion 77b and the second extension portion 77c of the first electrode 77 are separated, and the second pad portion 76a is shifted to the end of the semiconductor layer 5. With the light emitting element in FIG. 7E, the first pad portion 77a and the second pad portion 76a are opposite the side 5a of the semiconductor layer 5, and with the light emitting element in FIG. 7F, the first pad portion 77a and the second pad portion 76a are opposite the vertex 5b of the semiconductor layer 5.

Evaluation of Light Emitting Elements

Figure 8:
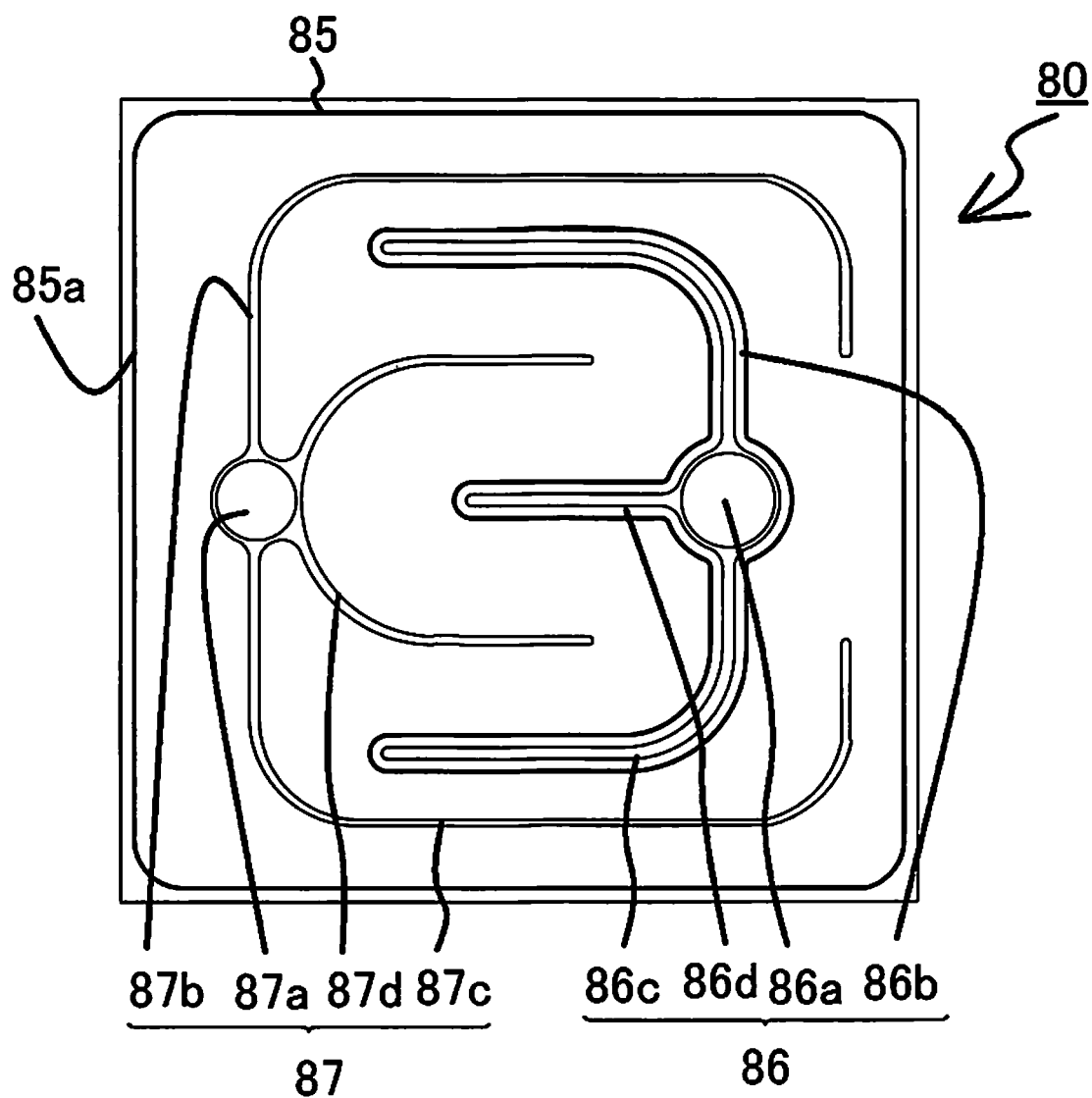
FIG. 8 is a schematic plan view of four different electrode shapes in the light emitting element according to a comparative example.

As shown in FIG. 8, as a comparative example, a light emitting element was produced by disposing a first electrode 87 and a second electrode 86 in a substantially square shape on a semiconductor layer 85 that is substantially square in plan view. The first pad portion 87a of the first electrode 87 is disposed so as to protrude more toward the side 85a of the semiconductor layer 85 than the first extension portion 87b and the second extension portion 87c extending from both sides of the first pad portion 87a.

The distribution in current density was analyzed by simulation software using the finite element method for the light emitting elements 1, 10, 20, and 30 of the above Examples and the light emitting element 80 of the comparative example. In the simulation results, a whiter coloring indicates sparser current, while a blacker coloring indicates denser current. In the case where there is no unevenness in current, this is shown as all the same coloring.

Figure 9A:
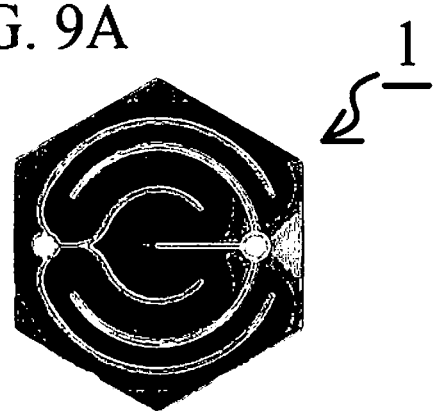
FIGS. 9A to 9D are simulated views illustrating the distribution of current density in the light emitting elements in Examples.
Figure 9B:
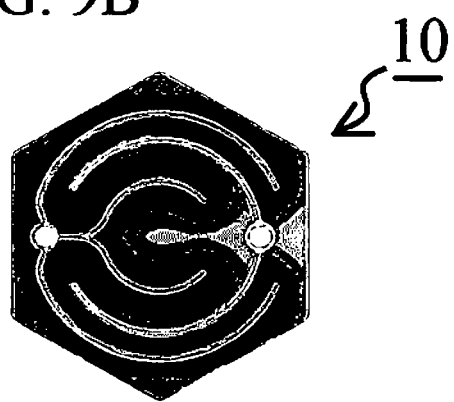
Figure 9C:
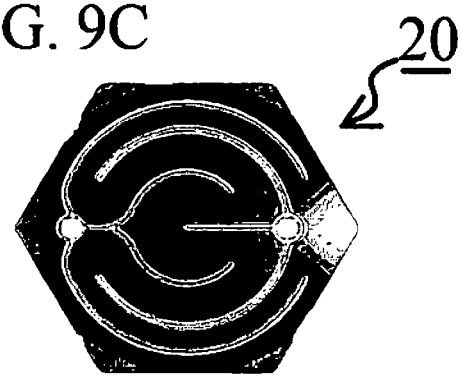
Figure 9D:
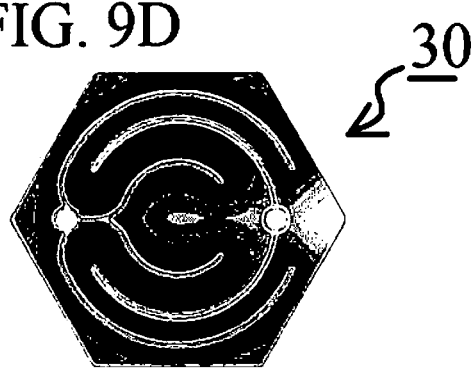
Figure 9E:
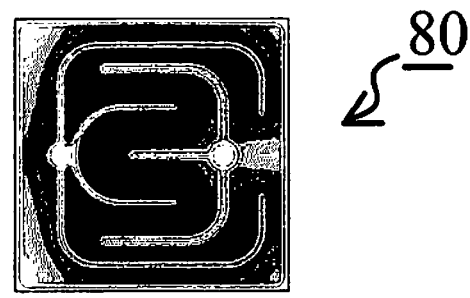
FIG. 9E is a simulated view illustrating the distribution of current density in the light emitting element in a comparative example.

As shown in FIGS. 9A to 9C, with the light emitting element 80 in the comparative example, it can be seen that portions of low current density (a portion that is darker than the other portion) appear in two of the corners of the semiconductor layer on the first pad portion 87a side. The reason for this is believed to be that the first electrode 87 is localized toward the side opposite the side 85a of the semiconductor layer, so that current does not accumulate between the first pad portion 87a and the side 85a of the semiconductor layer. In contrast, with the light emitting elements 1, 10, 20, and 30 of the Examples, there is a reduction in the portions of lower current density, and particularly with the light emitting elements 1 and 20 in which the first pad portion and second pad portion are opposite a side of the semiconductor layer, there is almost no portion of low current density, and a uniform light distribution is seen overall.

A current of 65 mA was applied to the light emitting elements 1, 10, 20, and 30 and to the light emitting element 80 of the comparative example, and the forward voltage (Vf) was compared. These results are given in Table 3.

TABLE 3

| Light emitting element | 1 | 10 | 20 | 30 | 80 |
|---|---|---|---|---|---|
| Forward voltage (V) | 2.781 | 2.783 | 2.786 | 2.788 | 2.791 |

With the light emitting element in the Examples, Vf is reduced over that of the light emitting element in the comparative example. In particular, with the light emitting elements 1 and 20 in which the first pad portion and second pad portion are opposite a side of the semiconductor layer, the Vf value is seen to be lower even than that of the light emitting elements 10 and 30 in which the first pad portion and second pad portion are opposite a vertex of the semiconductor layer.

Furthermore, a current of 65 mA was applied to the light emitting elements 1 and 20 and to the light emitting element of the comparative example, and the light output (Po) was measured. The unit of light output is mW. The power efficiency (WPE) was also calculated from Formula (1). The unit of current is mA, and the unit of voltage is V.

$$\text{Power conversion efficiency (\%)} = \{\text{light output} \div (\text{current} \times \text{voltage})\} \times 100 \quad (1)$$

These results are given in Table 4.

TABLE 4

| Light emitting element | 1 | 20 | 80 |
|---|---|---|---|
| Light output Po (mW) | 146.5 | 146.4 | 145.4 |
| Power efficiency WPE (%) | 80.4 | 80.3 | 79.3 |

In regard to light output and power efficiency, an increase was noted with both of the light emitting elements 1 and 20, in which the first pad portion and second pad portion were opposite a side of the semiconductor layer, versus the light emitting element 80 used in the comparative example.

Example 5

Figure 10:
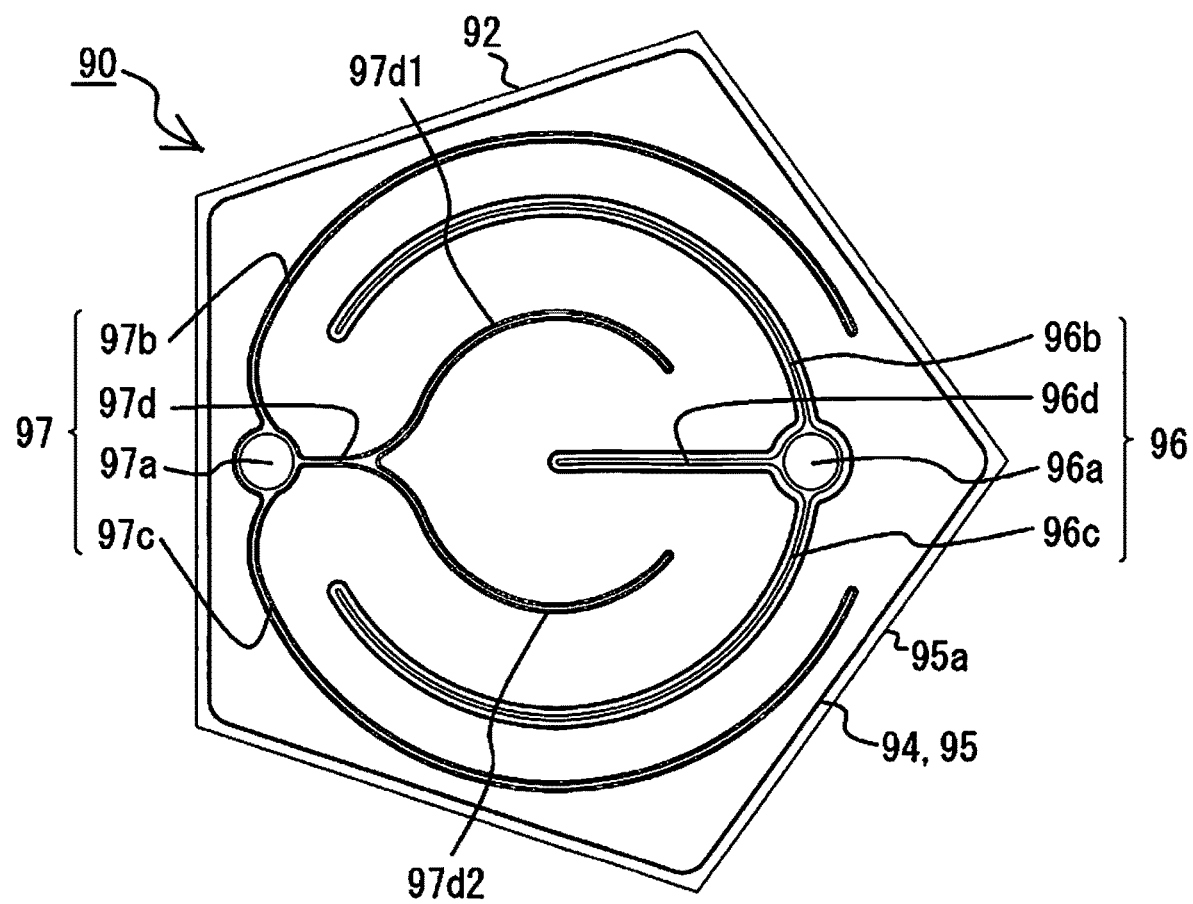
FIG. 10 is a schematic plan view of the light emitting element according to Example 5.

FIG. 10 shows the electrode shapes of the light emitting elements according to Example 5.

With the light emitting element shown in FIG. 10, the configuration is substantially the same as that of the light emitting element in Example 1, except that a substrate 92 and a semiconductor layer 95 are substantially pentagonal in plan view.

A second electrode 96 and a first electrode 97 respectively have a second pad portion 96*a* and a first pad portion 97*a* that are electrically connected to an external circuit. The second pad portion 96*a* and the first pad portion 97*a* are disposed on a line that passes through the center of gravity of the pentagonal shape of the semiconductor layer 95. The first pad portion 97*a* is disposed on a perpendicular bisector of a side 95*a*, and the second pad portion 96*a* is disposed opposite a vertex of the pentagon.

A first extension portion 97*b* and a second extension portion 97*c* that extend from the first pad portion 97*a* extend in an arc shape along the first imaginary circle A (see FIG. 1B) to which the first pad portion 97*a* is tangent on the inside. The first pad portion 97*a* is localized to the inside with respect to the first imaginary circle A.

The first electrode 97 further has a fifth extension portion 97*d* that extends from the first pad portion 97*a* toward the second pad portion 96*a*. The fifth extension portion 97*d* extends to the inside of a third extension portion 96*b* and a fourth extension portion 96*c* of the second electrode 96 (discussed below). The distal ends 97*d*1 and 97*d*2 of the fifth extension portion 97*d* branches into two parts along the third extension portion 96*b* and the fourth extension portion 96*c* (discussed below).

The second electrode 96 is such that the second pad portion 96*a*, the third extension portion 96*b*, and the fourth extension portion 96*c* are disposed more to the inside than the first imaginary circle A. The third extension portion 96*b* extends along the first extension portion 97*b* of the first electrode 97, and the fourth extension portion 96*c* extends along the second extension portion 97*c* of the first electrode 97.

The second electrode 96 further has a sixth extension portion 96*d* that extends in a straight line from the second pad portion 96*a* toward the first pad portion 97*a*.

With the light emitting element having this configuration, just as in Example 1, etc. good light output and power efficiency are obtained.

A light emitting element according to the present disclosure can be suitably employed for various lighting apparatuses, in particular, a light source for lighting, an LED display, backlight source for a liquid crystal display device, signals, a lighted switch, various sensors, various indicators, an auxiliary light source for moving image, other consumer light sources, or the like.

What is claimed is:

1. A light emitting element comprising:
a semiconductor layer which is in a planar shape of a polygon having at least five sides,
a second electrode provided on the semiconductor layer, and
a first electrode provided on the semiconductor layer and having
a first pad portion,
a first extension portion that is connected to the first pad portion and that extends along an imaginary circle, the first pad portion being tangent to the imaginary circle while the first pad portion is arranged inside of the imaginary circle, the center of the imaginary circle being at the same location as the center of gravity of the polygon shape, an area of the imaginary circle being smaller than an area of the semiconductor layer in a plan view with the imaginary circle surrounding about 55% to 80% of a total surface area of the semiconductor layer in the plan view, and the imaginary circle being entirely disposed on the inside of a periphery of the semiconductor layer in the plan view, and
a second extension portion that is connected to the first pad portion on an opposite side to the first extension portion, and that extends along the imaginary circle, wherein
the first extension portion and the second extension portion are connected to the first pad portion at positions that are arranged inside of the imaginary circle and that do not overlap the imaginary circle,
the second electrode has a second pad portion, a third extension portion that extends along the first extension portion from the second pad portion, and a fourth extension portion that extends along the second extension portion from the second pad portion, the second pad portion being positioned closer to the imaginary circle than to the center of the imaginary circle,
the first electrode has a fifth extension portion that extends from the first pad portion to inside of the third extension portion and the fourth extension portion, and the fifth extension portion branches into a pair of distal end portions that extend along the third extension portion and the fourth extension portion, respectively, inside of the third extension portion and the fourth extension portion in the plan view, a shortest length between one of vertices of the polygon of the semiconductor layer and one of the first extension portion and the second extension portion is larger than a shortest length between one of sides of the polygon of the semiconductor layer and one of the first extension portion and the second extension portion, the first pad portion and the second pad portion are disposed on a single straight line that passes through the center of gravity of the polygon shape.

2. A light emitting element comprising a semiconductor layer which is in a planar shape of a polygon having at least five sides, a second electrode provided on the semiconductor layer, and a first electrode provided on the semiconductor layer and having a first pad portion being localized to inside with respect to an imaginary circle, the center of the imaginary circle being at the same location as the center of gravity of the polygon shape, an area of the imaginary circle being smaller than an area of the semiconductor layer in a plan view with the imaginary circle surrounding about 55% to 80% of a total surface area of the semiconductor layer in the plan view, and the imaginary circle being entirely disposed on the inside of a periphery of the semiconductor layer in the plan view, a first extension portion that is connected to the first pad portion and that overlaps the imaginary circle, a second extension portion that is connected to the first pad portion on an opposite side to the first extension portion, and that overlaps the imaginary circle, wherein the first extension portion and the second extension portion are connected to the first pad portion at positions that are arranged inside of the imaginary circle and that do not overlap the imaginary circle, the second electrode has a second pad portion, a third extension portion that extends along the first extension portion from the second pad portion, and a fourth extension portion that extends along the second extension portion from the second pad portion, the second pad portion being positioned closer to the imaginary circle than to the center of the imaginary circle, the first electrode has a fifth extension portion that extends from the first pad portion to inside of the third extension portion and the fourth extension portion, and the fifth extension portion branches into a pair of distal end portions that extend along the third extension portion and the fourth extension portion, respectively, inside of the third extension portion and the fourth extension portion in the plan view, a shortest length between one of vertices of the polygon of the semiconductor layer and one of the first extension portion and the second extension portion is larger than a shortest length between one of sides of the polygon of the semiconductor layer and one of the first extension portion and the second extension portion, and the first pad portion and the second pad portion are disposed on a single straight line that passes through the center of gravity of the polygon shape.

3. The light emitting element according to claim 1, wherein the semiconductor layer is in the planar shape of hexagon.

4. The light emitting element according to claim 1, wherein the second electrode is disposed more to the inside of the semiconductor layer than the imaginary circle in the plan view.

5. The light emitting element according to claim 1, wherein the second pad portion of the second electrode is disposed facing one of the sides constituting the polygon shape.

6. The light emitting element according to claim 5, wherein the second pad portion is disposed on a perpendicular bisector of one of the sides constituting the polygon shape.

7. The light emitting element according to claim 5, wherein the first pad portion and the second pad portion are each disposed on a straight line that passes through the center of gravity of the polygon shape.

8. A light emitting element comprising:

a semiconductor layer which is in a planer shape of hexagon, and a first electrode provided on the semiconductor layer and having a first pad portion that is disposed near one side constituting the hexagon, a first extension portion that is connected to the first pad portion and that extends along an imaginary circle, the center of the imaginary circle being at the same location as the center of gravity of the hexagon, an area of the imaginary circle being smaller than an area of the semiconductor layer in a plan view with the imaginary circle surrounding about 55% to 80% of a total surface area of the semiconductor layer in the plan view, and the imaginary circle being entirely disposed on the inside of a periphery of the semiconductor layer in the plan view, and a second extension portion that is connected to the first pad portion on an opposite side to the first extension portion, and that extends along the imaginary circle, and a second electrode provided on the semiconductor layer and having a second pad portion that is disposed near another side facing to the one side constituting the hexagon, and more inside than the imaginary circle, the second pad portion being positioned closer to the imaginary circle than to the center of the imaginary circle, a third extension portion that extends along the first extension portion from the second pad portion, and a fourth extension portion that extends along the second extension portion from the second pad portion, wherein the first extension portion and the second extension portion are connected to the first pad portion at positions that are arranged inside of the imaginary circle and that do not overlap the imaginary circle, and the first electrode has a fifth extension portion that extends from the first pad portion to inside of the third extension portion and the fourth extension portion, and the fifth extension portion branches into a pair of distal end portions that extend along the third extension portion and the fourth extension portion, respectively, inside of the third extension portion and the fourth extension portion in the plan view, a shortest length between one of vertices of the hexagon of the semiconductor layer and one of the first extension portion and the second extension portion is larger than a shortest length between one of sides of the hexagon of the semiconductor layer and one of the first extension portion and the second extension portion, and the first pad portion and the second pad portion are disposed on a single straight line that passes through the center of gravity of the hexagon.

9. The light emitting element according to claim 8, wherein the first pad portion and the second pad portion are each disposed on a straight line that passes through the center of gravity of the hexagon.

10. The light emitting element according to claim 8, wherein the second pad portion is disposed on a perpendicular bisector of one of the sides constituting the hexagon.

11. The light emitting element according to claim 8, wherein the fifth extension portion branches into the distal end portions each extending in a curve along the third extension portion and the fourth extension portion, respectively.

12. The light emitting element according to claim 5, wherein the second electrode has a sixth extension portion that extends from the second pad portion toward the first pad portion.

13. The light emitting element according to claim 1, wherein the first extension portion and the second extension portion are separated near the second pad portion of the second electrode.

14. The light emitting element according to claim 1, wherein the first extension portion and the second extension portion are each arc-shaped.

* * * * *